United States Patent [19]

Bowman

[11] Patent Number: 4,636,705
[45] Date of Patent: Jan. 13, 1987

[54] SWITCHING CIRCUIT UTILIZING A FIELD EFFECT TRANSISTOR

[75] Inventor: William E. Bowman, Kokomo, Ind.

[73] Assignee: General Motors Corporation, Detroit, Mich.

[21] Appl. No.: 817,986

[22] Filed: Jan. 13, 1986

[51] Int. Cl.[4] ........................ H02J 7/14; H03K 17/687
[52] U.S. Cl. ........................ 322/28; 307/110; 307/578; 307/584; 322/73; 363/61; 363/17
[58] Field of Search ........................ 322/28, 35, 72, 73, 322/100; 320/1, 21; 363/17, 59; 307/109, 110, 571, 578, 584

[56] References Cited

U.S. PATENT DOCUMENTS

| | | | |
|---|---|---|---|
| 2,976,473 | 3/1961 | Shaw et al. | 322/28 |
| 3,646,369 | 2/1972 | Fujimoto | 307/482 X |
| 3,742,260 | 6/1973 | Boudry | 307/584 X |
| 3,808,468 | 4/1974 | Ludlow et al. | 307/578 |
| 3,820,009 | 6/1974 | Itoh et al. | 322/28 |
| 4,110,968 | 9/1978 | Berney | 318/129 |
| 4,146,264 | 3/1979 | Korzeniewski | 322/35 X |
| 4,259,600 | 3/1981 | Fellrath | 307/270 |
| 4,266,181 | 5/1981 | Muto et al. | 322/28 |
| 4,275,344 | 6/1981 | Mori et al. | 322/28 |
| 4,335,344 | 6/1982 | Gant | 322/28 X |
| 4,362,982 | 12/1982 | Akita et al. | 320/64 |
| 4,386,310 | 5/1983 | Sievers | 322/28 |
| 4,420,700 | 12/1983 | Fay et al. | 307/571 |
| 4,430,586 | 2/1984 | Hebenstreit | 307/578 X |
| 4,445,055 | 4/1984 | Bete | 307/571 |
| 4,484,084 | 11/1984 | Cheffer | 307/584 X |
| 4,486,702 | 12/1984 | Edwards | 322/28 |
| 4,533,863 | 8/1985 | Luhn et al. | 322/28 |
| 4,586,118 | 4/1986 | Mihalka | 320/1 X |

Primary Examiner—R. J. Hickey
Attorney, Agent, or Firm—C. R. Meland

[57] ABSTRACT

A switching circuit that utilizes an N-channel field effect transistor. The circuit can be used in a generator voltage regulator wherein the drain and source of the transistor are connected in series with the field winding of the generator. The circuit includes a capacitor that is repetitively charged and discharged. At the end of the charge period a gate bias voltage is developed that is applied to the gate of the transistor. The magnitude of the gate bias voltage that is developed is the sum of the capacitor voltage and the voltage of a voltage source. The capacitor is allowed to discharge until the gate bias voltage decreases to a value that is high enough to maintain the transistor conductive whereupon the discharge period is terminated and the capacitor is recharged. The system responds to the magnitude of the output voltage of the generator relative to a reference voltage and will cause the transistor to be biased conductive or nonconductive for total time periods that are equal to the sum of a plurality of consecutively occurring timing periods.

15 Claims, 3 Drawing Figures

SWITCHING CIRCUIT UTILIZING A FIELD EFFECT TRANSISTOR

This invention relates to a switching circuit that employs a field effect transistor and to a generator voltage regulator that utilizes the switching circuit to control the field current of a generator to thereby regulate the output voltage of the generator.

When an N-channel metal oxide semiconductor field effect transistor is used in a switching circuit that is connected to a voltage source and to a load in a high side drive configuration that is, where the drain is connected to the positive terminal of the voltage source and the load is connected between the source electrode of the transistor and the negative terminal of the voltage source, it is necessary to provide some means in addition to the voltage of voltage source to develop a gate voltage that is applied to the gate of sufficient magnitude to gate and maintain the transistor conductive between its drain and source. One known method of developing a gate voltage that is higher then the voltage magnitude of the voltage source is to employ a voltage doubler.

One of the objects of this invention is to provide an improved high side drive switching circuit that utilizes an N-channel field effect transistor that uses only one capacitor that serves to provide a plurality of control functions. Thus, in a switching circuit made in accordance with this invention the capacitor provides for circuit timing and it also provides a source of voltage for voltage doubling action. In addition, the capacitor is utilized when the circuit is in a certain mode of operation to cause the field effect transistor to be switched on and off to provide a series of voltage pulses that have a fixed duty cycle. This fixed duty cycle mode provides a means for exciting the field winding of a generator with an average current from a battery when the switching circuit of this invention is used in a voltage regulating system for a motor vehicle generator.

More specifically, in a switching circuit mode in accordance with this invention current is pumped into the capacitor during a charge mode until the voltage across the capacitor reaches some predetermined value. This voltage level is detected and when it is attained the voltage across the capacitor is stacked or added in series with the voltage across the direct voltage source to provide a gate bias voltage for the field effect transistor that is substantially the sum of the capacitor voltage and the voltage of the direct voltage source. At the time that the capacitor voltage attains the predetermined value the capacitor voltage and source voltage are stacked or added as described and at this time the circuit switches to a capacitor discharge mode wherein the capacitor begins to discharge. The capacitor now discharges until the sum of the capacitor voltage and that of the voltage source has decreased to a predetermined value or level. When this happens, that circuit switches to a capacitor charge mode wherein the capacitor begins to recharge and at the same time the capacitor voltage and voltage source are unstacked. The cycle that has been described repeats periodically that is, the capacitor is repetitively charged and discharged. During the repetitive charging and discharging of the capacitor and the stacking and unstacking of the voltage source and the capacitor voltage a junction or node in the circuit will have its voltage varied between the sum voltage (stacked condition) and the voltage across the capacitor (unstacked condition). This node or junction is connected to the gate of the field effect transistor. During the stacked condition the sum voltage is sufficient to gate the transistor conductive between its drain and source. Moreover, when the capacitor is discharging the voltage that that capacitor discharges down to is such that the sum voltage (stacked voltages) is high enough to maintain the transistor biased conductive. The repetitive charging and discharging of the capacitor and the stacking and unstacking of the capacitor voltage and the voltage of the voltage source develops a gate bias voltage for a period of time that substantially corresponds to the time period that the capacitor is discharging. This period of time is substantially constant and is a function of the RC time constant of the capacitor discharge circuit. The gate bias voltage is high enough throughout the discharge period of the capacitor to maintain the transistor biased conductive.

In order to control the time periods that that field effect transistor is biased conductive and nonconductive a switching device is connected between the gate of the transistor and the negative terminal of the voltage source. When this switching device is nonconductive the field effect transistor is in a condition to be biased conductive by the gate voltage that is developed and when the switching device is conductive the field effect transistor is biased nonconductive. The switching state of the switching device is controlled such that it can change its state only at a time when that capacitor has charged to the predetermined voltage level. With this arrangement the field effect transistor can be biased conductive for a total time period that is equal to the sum of a plurality of consecutive occurring time periods of equal duration. Moreover, when the switching device goes conductive the field effect transistor can be biased nonconductive for a total time period that is equal to the sum of a plurality of consecutive occurring time periods of equal duration. The gate drive voltage that is developed at the junction or node has negative voltage transitions that occur during the time that the capacitor is charging. In order to prevent these transitions from lowering the voltage applied to the gate of the field effect transistor to a value that might not be sufficient to maintain the transistor gated conductive a filter circuit is provided which is comprised of the gate capacitance of the field effect transistor and a resistor that is connected to the gate of the transistor.

In accordance with another aspect of this invention the switching circuit is arranged such that it can operate in a duty cycle mode wherein the field effect transistor is gated on and off to provide voltage pulses of a fixed duty cycle. In order to provide this mode of operation the capacitor is repetitively charged and discharged in a manner that has been described. However, when the capacitor is discharging and the voltage stacking has occurred the gate of the field effect transistor is connected to the negative terminal of the voltage source to bias the transistor nonconductive at a point in time when the gate voltage decreases to a level that is higher in voltage than a level which causes the capacitor to be placed in its charging mode. With this arrangement the field effect transistor is biased conductive for consecutive occurring equal time periods that corresponds to a certain percentage of the discharge time of the capacitor.

Another object of this invention is to provide a voltage regulator for a diode-rectified alternating current generator that utilizes the switching circuit that has been described for gating a field effect transistor that controls generator field current on and off as a function of magnitude of the output voltage of the generator to thereby maintain the generator output voltage at a desired regulated value. In the achievement of this object the drain electrode of the field effect transistor is connected to the positive output terminal of the generator and the field winding is connected between the source electrode and the negative output terminal of the generator. The gate of the field effect transistor is supplied with a gate bias voltage by the circuitry that has been described. When the voltage regulator is in the normal regulating mode and when the output voltage of the generator is below a desired regulated value the field effect transistor is biased conductive for a total time period that is equal to the sum of a plurality of consecutive occurring time periods of equal duration. When the generator output voltage increases to a level that is above the desired regulated value the field effect transistor is biased nonconductive for a total time period that is equal to the sum of a plurality of consecutive occurring time periods of equal duration. These consecutively occurring time periods are shorter in duration than the consecutively occurring time periods that are developed when generator voltage is below the desired regulated value.

An important advantage of the voltage regulator of this invention is that the regulator is not a so-called ripple regulator, that is it is not affected by the magnitude or period of the ripple voltage that appears at the direct voltage output terminals of the bridge rectifier that is connected to the alternating current generator.

Still another object of this invention is to provide a voltage regulator of the type that has been described that can be shifted from a normal regulation mode of operation to a field strobing mode of operation. The system is arranged to shift to the field strobing mode when the rotor of the generator is not rotating or is being rotated at a speed that is below a predetermined speed. In the field strobing mode the field is energized from the battery of a motor vehicle electrical system through the field effect transistor which is gated on and off. The transistor is gated on and off in such a manner that the field is energized for consecutive occurring equal time periods that have a certain duty cycle. This is achieved in a manner described above in connection with the description of the duty cycle mode of operation of the switching circuit.

IN THE DRAWINGS

The switching circuit of this invention will now be described in connection with a use as a voltage regulator for controlling the field current of a diode-rectified alternating current generator that supplies the electrical loads on a motor vehicle including the storage battery. In this type of use the switching of the field effect transistor controls field current. The use of the switching circuit is not limited to voltage regulator use and it can be used to control the voltage or current supplied to electrical loads other than a generator field load.

Figure 1:
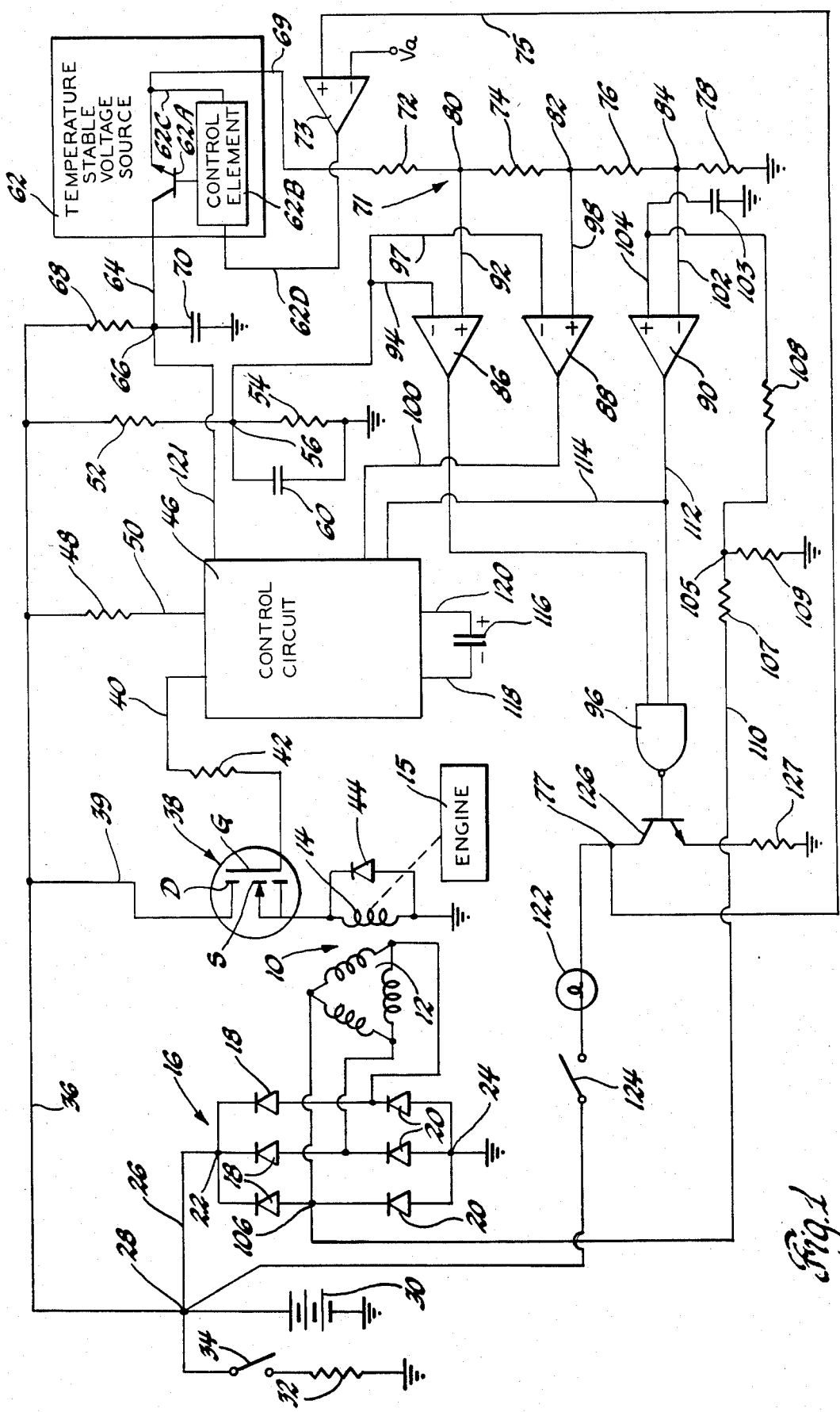
FIG. 1 is a schematic circuit diagram of a generator voltage regulating system made in accordance with this invention.

Referring now to the drawings and more particularly to FIG. 1, the reference numeral 10 generally designates an alternating current generator which has a three-phase Delta connected output winding 12 and a field winding 14. The output winding 12 may be Y-connected. The field winding 14 is carried by a generator rotor which is driven by the engine 15 of a motor vehicle in a manner well known to those skilled in the art. The magnitude of the output voltage, that is generated in output winding 12, is a function of the magnitude of the field current supplied to field winding 14. This field current is controlled by the voltage regulator of this invention in a manner to be described hereinafter.

The three-phase output winding 12 is connected to the AC input terminals of a three-phase full-wave bridge rectifier, generally designated by reference numeral 16, which is comprised of three positive diodes 18 and three negative diodes 20. The cathodes of diodes 18 are connected to a positive direct voltage output terminal 22 of bridge rectifier 16. The anodes of diodes 20 are connected to a negative direct voltage output terminal 24 of bridge rectifier 16. The negative output terminal 24 is grounded.

The direct voltage output terminal 22 is connected to a conductor 26 which in turn is connected to junction 28. A motor vehicle storage battery 30 has its positive terminal connected to junction 28 and has a negative terminal that is grounded. A motor vehicle electrical load is designated by reference numeral 32 and a switch 34 is shown connected between load 32 and junction 28. In a motor vehicle electrical system there are a plurality of electrical loads and switches connected between junction 28 and ground. The junction 28 is connected to a conductor 36.

The voltage regulator of this invention comprises a metal oxide semiconductor field effect transistor 38 that has a drain D, a gate G and a source S. This transistor is an N-channel enhancement mode type of field effect transistor. The drain D is connected to conductor 36 by conductor 39. The gate G is connected to conductor 40 by a resistor 42. The source S is connected to one side of field winding 14. The opposite side of the field winding is grounded. A field discharge diode 44 is connected across field winding 14. The circuit for energizing field winding 14 can be traced from junction 28 to conductors 36 and 39, through the drain and source of transistor 38 and then through field winding 14 to ground. The transistor 38 is biased conductive and nonconductive to control field current by a control circuit 46 which is shown in block diagram form in FIG. 1 and in detail in FIG. 2. The gate of transistor 38 is connected to control circuit 46 via conductor 40 and resistor 42. The control circuit 46 is also connected to conductor 36 by resistor 48 and conductor 50.

The voltage regulator has a voltage dividing voltage sensing circuit comprised of resistors 52 and 54 that are series connected between conductor 36 and ground. The resistors 52 and 54 have a junction 56. A capacitor 60 is connected across resistor 54. The resistors 52 and 54 function as a voltage divider and accordingly the voltage at junction 56 is a divided down representative of the voltage between conductor 36 and ground. Since the conductor 36 is connected to junction 28 the voltage at junction 56 will vary in accordance with variation in the voltage across battery 30 and this voltage is a function of the magnitude of the output voltage of generator 10. The voltage regulator controls the switching of transistor 38 to thereby vary field current to maintain the voltage appearing between junction 28 and ground substantially constant. In a 12 volt motor vehicle electrical system the regulated voltage to be maintained between junction 28 and ground may be about 14 volts.

The voltage regulator has temperature stable voltage reference circuit 62. This circuit has an input connected to conductor 64. The conductor 64 is connected to junction 66. This junction is connected to conductor 36 by a resistor 68. A capacitor 70 is connected between junction 66 and ground. The temperature stable voltage reference circuit 62 has an output connected to conductor 69. The purpose of the temperature stable voltage source 62 is to maintain a substantially constant voltage on conductor 69. The voltage source 62 has been illustrated somewhat schematically since regulators or voltage sources of this type are well known to those skilled in the art. Thus, the voltage source 62 comprises an NPN transistor 62A connected between conductors 64 and 69. The base of the transistor is connected to a control element 62B which serves to control the conduction of transistor 62A. The control element responds to the voltage on conductor 69 via conductor 62C and controls the conduction of transistor 62A to maintain a regulated constant voltage on conductor 69. The control element 62B also responds to the output of a low voltage comparator 73 via conductor 62D. The voltage comparator 73 compares the voltage on conductor 75 with a reference voltage $V_a$. The conductor 75 is connected to a junction 77 that is connected between a signal lamp 122 and the collector of an NPN transistor 126. If the voltage on conductor 75 does not exceed a certain minimum predetermined value the output of the low voltage comparator will cause the control element 62B to bias the transistor 62A nonconductive to thereby disconnect conductors 64 and 69. If the voltage on conductor 75 exceeds the predetermined minimum value the transistor 62A is controlled to conduct to thereby cause a regulated voltage to be developed on conductor 69.

The output voltage of the circuit 62 on conductor 69 is applied to a voltage divider 71 comprised of resistors 72, 74, 76 and 78 that are series connected between conductor 69 and ground. The voltage divider has junctions 80, 82 and 84. The voltage reference circuit 62 applies a substantially constant voltage that does not vary substantially with variations in temperature to voltage divider 71. The voltages at junctions 80, 82 and 84 progressively decrease due to the voltage division provided by voltage divider 71.

The voltage regulator has an overvoltage comparator 86, a setpoint comparator 88 and a generator phase voltage responsive comparator 90. The direct voltage source for these comparators is the voltage on conductor 69 and these comparators are connected to conductor 69 in a conventional manner by conductors which have not been illustrated. The overvoltage comparator 86 compares the voltage on conductor 92 with the voltage on conductor 94. The conductor 94 is connected to junction 56 and conductor 92 is connected to junction 80. The output of overvoltage comparator 86 is connected to a NAND gate 96.

The setpoint comparator 88 compares the voltage on conductor 97 with the voltage on conductor 98. Conductor 98 is connected to voltage divider junction 82 and conductor 97 is connected to voltage divider junction 56. The comparator 88 therefore compares a constant reference voltage (junction 82) with a voltage that varies with changes in the output voltage of generator 10 (junction 56). The output of setpoint comparator 88 is connected to control circuit 46 by a conductor 100.

The generator phase voltage comparator 90 compares the voltage on conductor 102 with the voltage on conductor 104. The conductor 102 is connected to junction 84 of voltage divider 71. The conductor 104 is connected to junction 105 of resistors 107 and 109 through resistor 108. A capacitor 103 is connected between conductor 104 and ground. One end of resistor 107 is connected to one of the AC input terminals 106 of bridge rectifier 16 by conductor 110. One end of resistor 109 is grounded. The output of comparator 90 is connected to NAND gate 96 via conductor 112 and to control circuit 46 via conductor 114. When the rotor of the generator that carries field winding 14 is not rotating there will be no voltage generated at junction 106. In the event that field winding 14 is open there likewise will be no voltage generated by generator 10 and accordingly no voltage developed at junction 106. With no voltage developed at junction 106 (open field or no generator rotor rotation) the relative voltages on conductors 102 and 104 are such as to cause the output of comparator 90, that is applied to conductors 112 and 114, to go low or to a zero voltage level which may be substantially ground potential. When generator voltage builds up toward the desired regulated value the voltage at conductor 104 will eventually exceed the voltage on conductor 102 which will cause the output of comparator 90 to go to a high positive voltage or to what may be termed a one level. This will occur when the rotor of generator 10 has been brought up to a predetermined speed by the engine that drives the generator rotor.

The control circuit 46 is connected to a capacitor 116 by conductors 118 and 120. The function of capacitor 116 will be described hereinafter in connection with a detailed description of the control circuit 46 shown in FIG. 2. The control circuit 46 is also connected to junction 66 by a conductor 121.

The motor vehicle electrical system of FIG. 1 has a signal lamp 122, one side of which is connected to a manually operable ignition switch 124. The switch 124 is connected between lamp 122 and junction 28. Energization of signal lamp 122 is controlled by a semiconductor switch that takes the form of an NPN transistor 126. The collector of transistor 126 is connected to one side of lamp 122 and its emitter is grounded through resistor 127. The base of transistor 126 is connected to the output of NAND gate 96 which biases transistor 126 either conductive or nonconductive. When ignition switch 124 is closed and transistor 126 is biased conductive the signal lamp 122 is energized.

Figure 2:
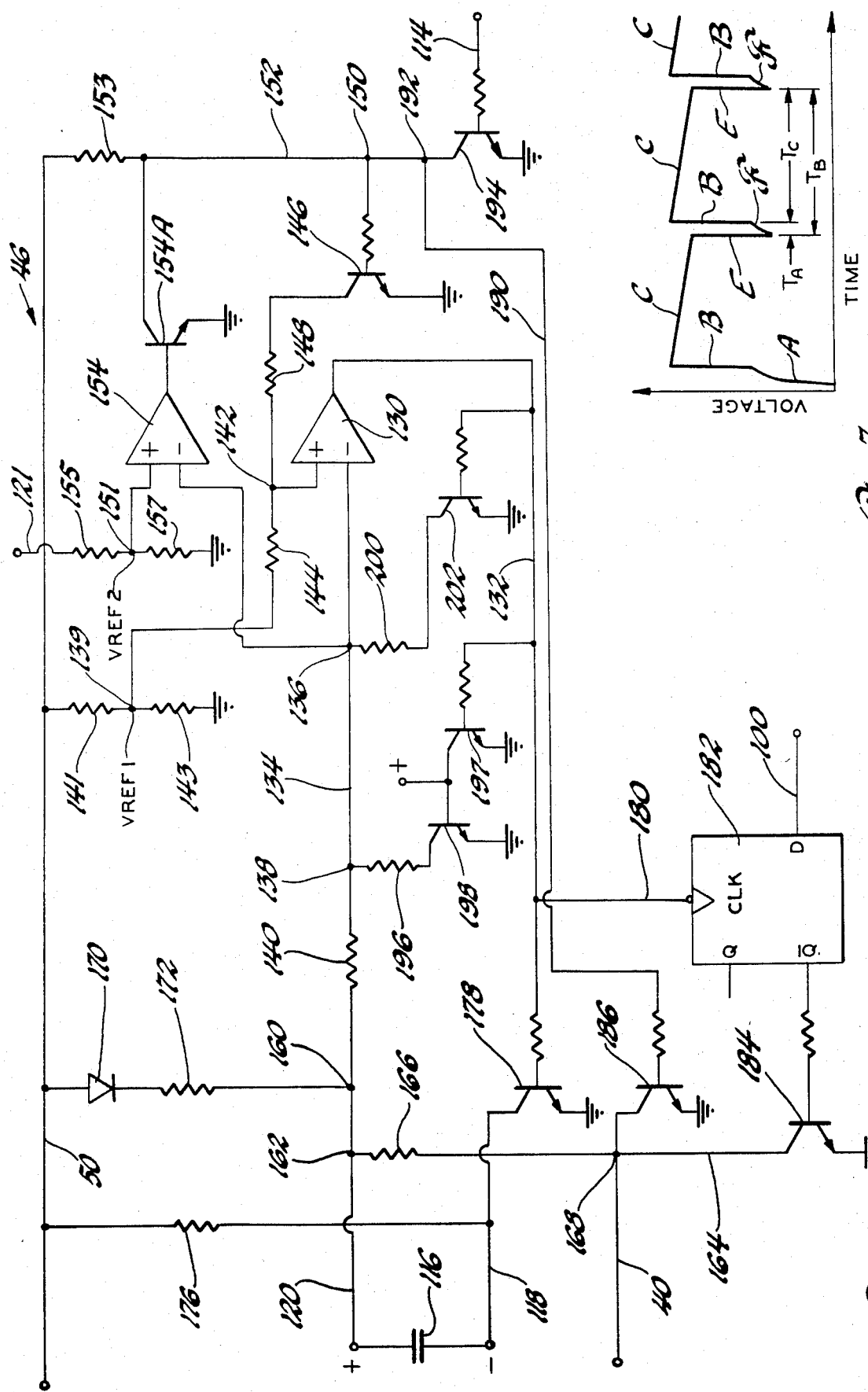
FIG. 2 is a schematic circuit diagram of a control circuit which is shown as a block in FIG. 1.

Referring now to FIG. 2 the control circuit 46, which is illustrated as a block in FIG. 1, will now be described. In FIG. 2 the same reference numerals have been used as were used in FIG. 1 to identify corresponding conductors. In FIG. 2 reference numeral 130 designates a timing comparator having an output connected to conductor 132. The negative input terminal of the timing comparator 130 is connected to conductor 134 which is connected to junctions 136 and 138 and one side of resistor 140. The positive input terminal of comparator 130 is connected to a positive reference voltage VREF1 provided at junction 139 of voltage divider resistors 141 and 143 which are series connected between conductor 50 and ground. The connection to the positive input terminal of comparator 130 is made via junction 142 and resistor 144. The junction 142 is connected to one side of a semiconductor switch or gate which takes the form of an NPN transistor 146. The collector of transistor 146 is connected to junction 142 through resistor 148. The emitter of transistor 146 is grounded and its base is connected to junction 150 on conductor 152.

The control circuit 46 has another voltage comparator 154 that includes a switching device comprised of an NPN transistor 154A. The collector of transistor 154A is connected to conductor 152 and its emitter is grounded. When transistor 154A is conductive it grounds conductor 152. A resistor 153 is connected between conductors 152 and 50. The negative input terminal of comparator 154 is connected to junction 136. The positive input terminal of comparator 154 is connected to a positive reference voltage VREF2 developed at junction 151 of voltage divider resistors 155 and 157 connected between conductor 121 and ground. Reference voltage VREF2 has a larger magnitude than reference voltage VREF1.

The conductor 120, which is connected to one side of capacitor 116, is connected to one side of resistor 140 and to junctions 160 and 162. Junction 162 is connected to a conductor 164 through a resistor 166. Conductor 164 is connected to junction 168 which in turn is connected to conductor 40 and therefore to the gate G of field effect transistor 38 through resistor 42.

A diode 170 and resistor 172 are series connected between conductor 50 and junction 160. A resistor 176 is connected between conductor 50 and conductor 118. The conductor 118 is connected to one side of a gate or semiconductor switch which takes the form of an NPN transistor 178. The collector of transistor 178 is connected to conductor 118 and its emitter is grounded. The base of transistor 178 is connected to conductors 132 and 180. Conductor 180 is connected to the clock input of a negative edge triggered D-type flip-flop 182. The D terminal of flip-flop 182 is connected to conductor 100 which is connected to the output of setpoint comparator 88. The $\overline{Q}$ terminal of flip-flop 182 is connected to the base of an NPN transistor 184. The collector of transistor 184 is connected to conductor 164 and its emitter is grounded. The transistor 184 provides a semiconductor switch or gate.

A gate or semiconductor switch is connected between junction 168 and ground and it takes the form of an NPN transistor 186. The collector of transistor 186 is connected to junction 168 and its emitter is grounded. The base of transistor 186 is connected to conductor 190 which in turn is connected to conductor 152 at junction 192. A gate or semiconductor switch which takes the form of an NPN transistor 194 is connected between junction 192 and ground. The collector of transistor 194 is connected to junction 192 and its emitter is grounded. The base of transistor 194 is connected to conductor 114 and accordingly to the output of phase voltage comparator 90.

A gate or semiconductor switch is connected between junction 138 and ground through resistor 196. This gate or semiconductor switch takes the form of an NPN transistor 198, the collector of which is connected to resistor 196. The emitter of transistor 198 is grounded and its base is connected to the collector of NPN transistor 197. The base of transistor 197 is connected to conductor 132 and its emitter is grounded. When the voltage on conductor 132 is high transistor 198 is biased nonconductive and when the voltage on conductor 132 is low transistor 198 is biased conductive.

Another gate or semiconductor switch is connected between junction 136 and ground through a resistor 200. This gate or semiconductor switch takes the form of an NPN transistor 202 having its collector connected to resistor 200 and its emitter grounded. The base of transistor 202 is connected to conductor 132.

The operation of the voltage regulator will now be described with particular emphasis on the operation of the control circuit 46 shown in detail in FIG. 2. In describing the operation of control circuit 46 reference will be made to FIG. 3 which illustrates the voltage developed between conductor 120 and ground at various time periods when the voltage regulator is operating in a normal regulation mode. In describing this operation it will be assumed that the generator 10 is being driven by engine 15 at a speed that is sufficient to develop a voltage at junction 106 that is high enough to cause the comparator 90 to develop a high or one level voltage on conductors 112 and 114. The system is now operating in its regulation mode. With a high voltage on conductor 114, transistor 194 is biased conductive thereby causing transistors 146 and 186 to be biased nonconductive. Assume further that the output voltage of generator 10 is such that the voltage between junction 28 and ground is below the desired regulated value to be maintained by the voltage regulator. Under this condition of operation more field current should be applied to field winding 14 in order to increase the voltage generated by generator 10. The output of setpoint comparator 88 is now high or at a one level because the actual output voltage of generator 10 is such that the voltage at junction 56 (sensed voltage) is less than the voltage at junction 82 (reference voltage). Accordingly the voltage on conductor 100 is high or at a high level.

Initially the capacitor 116 has no voltage across it and the output of timing comparator 130 that is applied to conductor 132 is at a high or one level. The high level voltage on conductor 132 biases transistors 178 and 202 conductive and biases transistor 198 nonconductive. Since transistor 178 is conductive, capacitor 116 charges through diode 170, resistor 172, conductor 120, capacitor 116, conductor 118 and the collector and emitter of transistor 178. Capacitor 116 charges along the portion A of the waveform illustrated in FIG. 3. Since transistor 202 is conductive, resistors 140 and 200 are connected in series across capacitor 116. These resistors form a voltage divider having a junction 136 which has a voltage that is a divided representation of the voltage across capacitor 116. When the capacitor 116 charges up to a voltage such that voltage at junction 136 equals the voltage VREF1, the output of timing comparator 130 switches from a high state to a low state. When the output of comparator 130 goes low, transistors 178 and 202 are biased nonconductive and transistor 198 is biased conductive. When transistor 178 goes nonconductive, there no longer is a charge path for capacitor 116. In addition the voltage on capacitor 116 is now added in series to the voltage on conductor 50 and applied across the gate and source of transistor 38. Thus, the positive capacitor voltage on conductor 120 is applied to the gate G of transistor 38 via resistor 166 and conductor 40. The negative end of capacitor 116 is connected to the positive voltage on conductor 50 by resistor 176. What has just been described provides a voltage doubling action. The addition or what may be termed the stacking of the voltages causes the voltage transition B shown in FIG. 3. This gate bias voltage that is developed at conductor 120 is high enough to bias transistor 38 conductive and maintains it conductive in a manner to be more fully described hereinafter.

When the output of comparator 130 went low, as described above, transistor 202 was biased nonconductive and transistor 198 conductive. Under this condition of operation resistor 200 is disconnected from ground and resistors 140 and 196 are now series connected to form a discharge circuit or path for capacitor 116. Capacitor 116 now discharges through conductor 120, resistors 140 and 196, battery 30, resistor 48 and resistor 176 to conductor 118. Charge is removed from capacitor 116 via resistor 166 and placed on the gate G during the discharge period of capacitor 116. When capacitor 116 begins to discharge, the voltage at junction 162 is the voltage on conductor 50 added to the capacitor voltage. A divided down representation of this voltage is provided at junction 138 by resistors 140 and 196 that provide a voltage divider. As capacitor 116 discharges the voltage at junction 162 decreases exponentially along line C shown in FIG. 3 and a divided down representation of this voltage is developed at junction 138. When the voltage at junction 138 decreases to a level where it equals VREF1 the output of comparator 130 switches from a low state back to a high state. When this happens the voltage at junction 162 makes a sharp negative transition E shown in FIG. 3. The cycle of operation now repeats, beginning with the charging of capacitor 116 when transistor 178 goes conductive. Repeated cycles of operation are illustrated in FIG. 3 where repeated charging voltage transitions are designated F.

Figure 3:
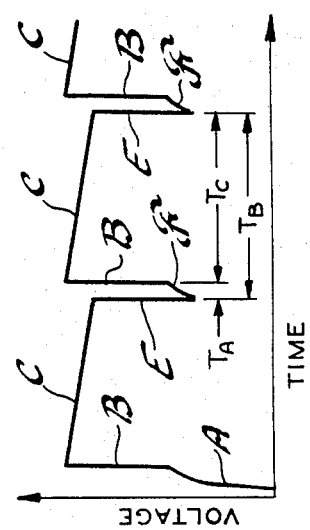
FIG. 3 illustrates a voltage waveform of a voltage that is developed by the control circuit shown in FIG. 2.

In FIG. 3 the time period $T_A$ is the time period that capacitor 116 is in a charging mode which corresponds to the time period that transistor 178 is conductive. The time period $T_B$ is a timing period of one cycle of operation, that is the time period $T_A$ (charge time) added to a time period $T_C$ that capacitor 116 is in a discharge mode. The time period $T_C$ that capacitor 116 is in a discharge mode corresponds to the time period that transistor 178 is nonconductive. Putting it another way, time period $T_B$ is the time period between consecutive occurring initiations of the charging mode for capacitor 116. The timing period $T_A$ is very short as compared to timing period $T_B$. By way of example, timing period $T_B$ may be about 2.5 to 3 milliseconds and timing period $T_A$ about 100 microseconds.

Each time the capacitor attains its predetermined charging voltage (at the end of time period $T_A$) the output of comparator 130 switches to a low state and this voltage transistion (high to low) is applied to the clock input of flip-flop 182 to clock the state of line 100 (high or low) to $\overline{Q}$ output of flip-flop 182 and accordingly to the base of transistor 184. The flip-flop 182, when clocked, inverts the state of the voltage then on conductor 100. Thus, if conductor 100 is high when flip-flop 182 is clocked the $\overline{Q}$ output will go low and vice versa. The $\overline{Q}$ output maintains the state it has been clocked into and can only change its state when a clock pulse on line 180 occurs.

Assuming now that the generator output voltage is below the desired regulated value the conductor 100 will have a high or one level. Assume further that the $\overline{Q}$ output of flip-flop 182 has been clocked to a low level the transistor 184 is biased nonconductive. Accordingly junction 168, which is connected to the gate of transistor 38, is not grounded by transistor 184. In the condition of operation that has been described the capacitor 116 will continue to charge and discharge during consecutive occurring cycles or timing periods $T_B$ and transistor 38 will be gated conductive for a time period that corresponds substantially to the sum of a plurality of consecutively occurring timing periods $T_B$. In this regard, it is noted that at the point in time when the discharge mode of capacitor 116 is completed and the charging mode begins, the voltage at junction 162 will suddenly decrease by the magnitude of the voltage between conductor 50 and ground since this voltage is not now being added to the voltage on capacitor 116 due to the fact that transistor 178 is now conductive to thereby ground conductor 118. This decrease in voltage is the voltage transition E shown in FIG. 3. Even though the voltage at junction 162 experiences this sharp drop the field effect transistor 38 is nevertheless maintained biased conductive. Thus, the gate capacitance of transistor 38, together with the resistor 42, form an RC filter which smoothes the voltage applied to the gate of transistor 38 so that the gate and source do not experience a sharp decreasing voltage transistion and the transistor 38 remains biased conductive. Resistor 42 may be about 50K ohms and the gate capacitance of transistor 38 may be about 2000 picofarads.

The voltage magnitude that capacitor 116 discharges down to during time period $T_C$ must be high enough so that when it is added to the voltage on conductor 50 a resultant gate voltage on junction 162 is high enough to keep transistor 38 biased fully on. The capacitor charge time $T_A$ must be short with respect to the RC time constant of the gate capacitance of transistor 38 and resistor 42.

As long as generator voltage is below the desired regulated value (one voltage level on conductor 100) the transistor 38 will remain biased continuously conductive for a total time period that is equal substantially to the sum of a plurality of consecutively occurring time periods $T_B$. This is further explained hereinafter in connection with the mode of operation wherein the setpoint comparator output voltage on line 100 goes from a one level to a zero level which is caused by generator output voltage going above the desired regulated value.

Assume now that sufficient field current has been supplied to field winding 14 so that the output voltage of generator 10 increases to a value such that the voltage between junction 28 and ground (voltage applied to battery 30) exceeds the desired regulated value. At the time that generator output voltage exceeds the desired regulated value the voltage on conductor 100 will go from a one level to zero level so that the voltage at the D input terminal of flip-flop 182 is now at a zero level. The Q output of flip-flop 182 is still at a low level so that the transistor 38 remains biased conductive. Eventually a clock pulse will be applied via conductor 180 to the clock input of flip-flop 182 to cause the $\overline{Q}$ output voltage level to go from a low level to a high level thereby biasing transistor 184 conductive. The clock pulse is generated on lines 132 and 180 at the end of the charge mode of capacitor 116 or at the end of timing period $T_A$. When the $\overline{Q}$ voltage went high to bias transistor 184 conductive the transistor 184 connects junction 168 to ground thereby grounding line 40 that is connected to the gate G of transistor 38. Accordingly, transistor 38 is biased nonconductive to cutoff field current and the output voltage of generator 10 decreases. During this mode of operation capacitor 116 continues going through consecutive cycles or timing periods $T_B$ wherein the capacitor continues to be charged and discharged. The timing period $T_B$ during this mode of operation is decreased as compared to the mode wherein the transistor 38 is biased conductive because the discharge time $T_C$ of capacitor 116 is decreased. Thus, when transistor 184 is biased conductive to cause transistor 38 to be biased nonconductive, conducting transistor 184 connects resistor 166 to ground. The discharge path for capacitor 116 now comprises resistors 140 and 196 connected in parallel with resistor 166 which causes the discharge time period of capacitor 116 to be smaller than it was when transistor 184 was biased nonconductive. The time period that transistor 38 is biased nonconductive will correspond substantially to at least one timing period $T_B$ and in most or all cases will be equal to the sum of a number of consecutively occurring time periods $T_B$. This is caused by the fact that when the voltage on conductor 100 is low or zero, causing transistor 38 to be biased nonconductive, transistor 38 cannot be subsequently biased conductive until the voltage on conductor 100 goes to a high state and this high state subsequently clocked by flip-flop 182 when a clock pulse is applied to conductor 180 at the end of time period $T_A$. When the clock pulse occurs the one level voltage on conductor 100 is translated into a zero level voltage at the $\overline{Q}$ output of flip-flop 182 which in turn causes transistor 184 to be biased nonconductive and transistor 38 conductive.

The normal regulation mode of operation of the system can be summarized as follows:

(1) Regardless of the level of voltage on conductor 100 the capacitor 116 charges and discharges over consecutively occurring timing periods $T_B$.

(2) When the voltage on conductor 100 is high or at a one level, which is indicative of a generator output voltage that is lower than the desired regulated value, the field effect transistor 38 is biased conductive and it remains biased conductive for at least one timing period $T_B$ and in most or all cases for a time period that is equal to the sum of a plurality of consecutively occurring timing periods $T_B$.

(3) When the voltage on conductor 100 is low or at a zero level, which is indicative of a generator output voltage that is higher than the desired regulated value, the field effect transistor 38 is biased nonconductive and remains nonconductive for at least one timing period $T_B$ and in most or all cases for a time period that is substantially equal to the sum of a plurality of consecutively occurring time periods $T_B$. In this case the timing period $T_B$ is shorter than the case where generator voltage is below the desired regulated value as has been explained above. This is because the discharge period of the capacitor 116 is shorter. Because of this shorter discharge period the system can go from a mode wherein transistor 38 is nonconductive to a conductive mode in a somewhat shorter period of time than when going from a conductive to a nonconductive mode.

(4) The change in the conductive or nonconductive state of transistor 184 and hence a change in the switching state of field effect transistor occurs after the voltage on conductor 100 has changed state and then only after a clock pulse has been developed on conductors 132 and 180. The clock pulse is developed at the end of the charge period of capacitor 116 or, in other words, at the end of timing period $T_A$.

The foregoing description has described the normal regulation mode of operation wherein the generator is being driven at a sufficient speed to cause the voltage on conductor 114 to be at a high or one level.

Assume now that the alternator is not being driven by engine or in other words the rotor of the generator is not rotating, there will be no voltage developed at junction 106 and accordingly the output of comparator 90, which is applied to conductor 114, will be at a low or zero level. This will cause transistor 194 to be biased nonconductive. In the normal regulation mode, which has been described, generator speed is high enough to cause the voltage at conductor 114 to be at a high or one level thereby biasing transistor 194 conductive which connects junction 192 to ground. Assuming again no generator rotation, the capacitor 116 charges in the same manner that has been described to a voltage level where the voltage at junction 136 equals VREF1 whereupon the timing comparator 130 causes the battery voltage to be stacked or added to the capacitor voltage. At this time comparator 130 places the circuit in a capacitor discharge mode and capacitor 116 therefore starts to discharge. When the voltages are added or stacked the voltage at conductor 134 and junction 136 accordingly sharply increases due to the stacking or voltage addition and it is applied to the negative input terminal of comparator 154. This voltage goes higher than the reference voltage VREF2 applied to the positive input terminal of comparator 154 from junction 151 and the output of comparator 154 causes transistor 154A to be biased conductive to thereby ground conductor 152. This causes transistors 146 and 186 to be biased nonconductive. With transistor 186 biased nonconductive junction 168 is not grounded and accordingly the voltage at junction 162 will bias transistor 38 conductive. The field winding 14 is now energized by battery 30. When capacitor 116 discharges the voltage applied to the negative terminal of comparator 154 decreases and when it drops to VREF2 the comparator 154 switches to a state wherein transistor 154A is biased nonconductive. This causes transistor 146 to be biased conductive. The conduction of transistor 146 causes the voltage at junction 142 to be provided by a voltage divider comprised of resistors 144 and 148 instead of only through resistor 144. The reference voltage applied to the positive terminal of timing comparator 130 from junction 142 has accordingly been reduced or attenuated and the discharge period of capacitor 116 will be increased since it will take longer for the voltage on junction 136 to drop to the value of the voltage at junction 142. When the voltage on junction 136 decreases to VREF2 as capacitor 116 discharges conductor 152 is disconnected from ground by the nonconductive state of transistor 154A and accordingly the voltage on conductors 152 and 190 will bias transistor 186 conductive thereby grounding conductor 40 and causing transistor 38 to be biased nonconductive. Moreover, the voltage on conductor 152 will bias transistor 146 conductive thereby connecting one end of resistor 148 to ground. Resistors 144 and 148 now form a voltage divider having a junction 142, as previously explained.

In the mode of operation that has just been described, transistor 38 is biased conductive when voltage stacking or addition occurs and is biased nonconductive during the discharge period of capacitor 116, at a point in time when the voltage on conductor 134 drops to the value VREF2. This occurs prior to the time that the voltage on conductor 134 drops to the voltage at junction 142. When the voltage drops to VREF2 transistor 38 is biased nonconductive to cutoff field current and when it drops to a lower voltage the discharge mode for capacitor 116 is terminated and the charge mode begins. The circuit, including the magnitudes of VREF1 and VREF2, is arranged such that during this mode of operation the transistor 38 is biased conductive for about 27% of a timing period or in other words a 27% duty cycle. The timing period corresponds to the discharge period of capacitor 116. The consecutive occurring conductive periods of transistor 38 occur at a constant frequency and a fixed duty cycle of substantially 27%. This mode of operation may be termed the field strobing mode and operates to excite the field winding 14 from battery 30 with an average current that is sufficient to cause the generator voltage to buildup when the generator rotor is rotated. The field strobing mode is operative whenever there is no rotation of the generator rotor and ignition switch 124 is closed. When the generator is rotating at a speed greater than a predetermined speed, the voltage on conductor 114 goes high biasing transistor 194 conductive and connecting junction 192 to ground. This grounds conductor 152 so that the output of comparator 154 has no effect on the system and the field strobing mode accordingly cannot occur. The system now has been shifted into the normal regulation mode.

The voltage regulating system of FIG. 1 is capable of indicating certain faults in the system by energizing lamp 122 when switch 124 is closed. During an overvoltage condition, which is sensed by overvoltage comparator 86, a signal is applied to NAND gate 96 causing transistor 126 to be biased conductive and thereby energizing lamp 122. The lamp is also energized when there is no rotation of the generator rotor (no voltage at junction 106) through the operation of phase voltage comparator 90 and NAND gate 96. If the field winding 14 is open there is no voltage developed at junction 106 and accordingly lamp 122 is energized.

The following is a brief summary of the operation of the voltage regulating system of this invention. When the operator of a motor vehicle closes the ignition switch to start the engine the voltage regulator is energized by virtue of the voltage developed at junction 77. The regulator will now operate in the field strobe mode with the transistor 38 being gated on and off to provide the previously mentioned 27% duty cycle. This causes an average current to be supplied to field winding 14 from battery 30 which provides initial excitation for field winding 14. When engine 15 starts it drives the rotor of generator 10 and the generator output voltage builds up. At a certain generator rotor speed there will be a voltage developed at junction 106 of a sufficient magnitude to cause the output of comparator 90 to go high. This will cause the voltage regulator to shift from the field strobe mode to the regulation mode and will cause the signal lamp 122 to become deenergized to thereby turn it off.

The function of the low pass RC filter comprised of resistor 42 and the gate capacitance of transistor 38 in smoothing the gate voltage has been described. This filter also reduces radio interference.

The adding or stacking of the voltage across capacitor 116 and the voltage on conductor 50 so as to provide a sum voltage on conductor 120 has been described as a voltage doubling action. The system does provide a voltage doubling action but it is arranged such that the voltage developed at conductor 120 is not exactly double the voltage on conductor 36. As an example, when the system is operating in the regulation mode, the system is preferably arranged such that maximum voltage developed at conductor 120 (end of capacitor charge mode) is about 1.8 times the voltage on conductor 36 and this voltage drops to about 1.65 times the voltage on conductor 36 at the end of the discharge of capacitor 116.

The voltage for charging capacitor 116 and the voltage provided at junction 139 (VREF1) are both supplied from conductor 50 which in turn is supplied by conductor 36 and junction 28. The voltage of conductor 50 varies with changes in voltage of junction 28 and accordingly with changes in voltage across battery 30. The capacitor charging voltage and voltage VREF1 therefore both change in the same direction with changes in voltage across battery 30.

The consecutive occurring timing periods of the same kind that are developed in the system of this invention are of substantially equal time periods. As one example, when the system is operating in the regulation mode and generator output voltage is below the desired regulated value the consecutive occurring time periods $T_A$ are of equal duration as are consecutive occurring timing periods $T_B$ and $T_C$.

The flip-flop 182 checks the status of the voltage on conductor 100 (high or low) each time a clock pulse is developed on line 180. If the status of the voltage level on conductor 100 has not changed from one clock pulse to the next occurring clock pulse the next occurring clock pulse will not cause a change in the $\overline{Q}$ output of flip-flop 182. If a change in the voltage level on conductor 100 has occurred just prior to a clock pulse the $\overline{Q}$ output will change state. This checking of the status of the voltage on conductor 100 and the outputting of the appropriate gate control signal is done in a periodic fashion which is independent of the ripple frequency of the ripple voltage developed at junction 22 of bridge rectifier 16. The voltage regulator accordingly is not a so-called ripple regulator.

The flip-flop 182 and associated circuitry provide a digital sample and hold function and can take other forms as long as the system is controlled in a manner that has been described.

As previously explained, the gate voltage that is developed when the capacitor voltage is added to the voltage on conductor 50 is high enough to bias transistor 38 fully conductive and remains high enough during capacitor discharge to keep transistor 38 biased fully conductive. This magnitude of gate voltage is well above the threshold voltage of transistor 38 so that it is biased fully conductive or in other words, saturated.

The voltage on conductor 50 is slightly lower than the voltage on conductor 36 and accordingly the magnitude of the voltage that is added to the capacitor voltage when the voltages are stacked or added is a voltage magnitude that is substantially equal to the voltage across battery 30.

The voltage regulator that has been described is preferably fabricated as a hybrid integrated circuit module that can be secured to a generator end frame.

The embodiments of the invention in which an exclusive property or privilege is claimed are defined as follows:

1. A switching circuit for connecting and disconnecting a voltage source and an electrical load comprising, a direct voltage source having positive and negative terminals, an N-channel field effect transistor having a gate, a drain and a source, means connecting said drain to the positive terminal of said voltage source, an electrical load connected between said source of said transistor and said negative terminal, a capacitor, a charge circuit for charging said capacitor, a discharge circuit for discharging said capacitor, means responsive to the voltage across said capacitor attaining a predetermined charge voltage when said capacitor is charging for disabling said charge circuit while substantially simultaneously enabling said discharge circuit to cause said capacitor to begin to discharge, means responsive to said capacitor attaining said predetermined voltage for causing the voltage of said voltage source and the voltage attained by said capacitor to be added in series to provide a gate bias voltage that is substantially the sum of the voltage of said voltage source and the voltage attained by said capacitor and for applying said gate bias voltage to said gate to thereby provide a gate bias voltage that is high enough to bias said transistor conductive between its drain and source, means for sensing said gate bias voltage as said capacitor discharges and for causing said charge circuit to be re-enabled to recharge said capacitor when said gate bias voltage decreases to a predetermined value due to discharge of said capacitor, said predetermined value of gate bias voltage being high enough to maintain said transistor biased conductive, and control means comprising a switching means for at times connecting said gate to said negative terminal to thereby cause said transistor to be biased nonconductive, said switching means when nonconductive permitting said transistor to be biased conductive.

2. A switching circuit for connecting and disconnecting a voltage source and an electrical load comprising, a direct voltage source having positive and negative terminals, an N-channel field effect transistor having a gate, a drain and a source, means connecting said drain to the positive terminal of said voltage source, an electrical load connected between said source of said transistor and said negative terminal, a capacitor, a charge circuit for charging said capacitor, a discharge circuit for discharging said capacitor, means responsive to the voltage across said capacitor attaining a predetermined charge voltage when said capacitor is charging for disabling said charge circuit while substantially simultaneously enabling said discharge circuit to cause said capacitor to begin to discharge, means responsive to said capacitor attaining said predetermined voltage for causing the voltage of said voltage source and the voltage attained by said capacitor to be added in series to provide a gate bias voltage that is substantially the sum of the voltage of said voltage source and the voltage attained by said capacitor and for applying said gate bias voltage to said gate to thereby provide a gate bias voltage that is high enough to bias said transistor conductive between its drain and source, means for sensing said gate bias voltage as said capacitor discharges and for causing said charge circuit to be re-enabled to recharge said capacitor when said gate bias voltage decreases to a predetermined value due to discharge of said capacitor, said predetermined value of gate bias voltage being high enough to maintain said transistor biased conductive, and control means comprising a switching means connected between said gate and said negative terminal, said switching means when conductive causing said transistor to be biased nonconductive, said switching means when nonconductive permitting said transistor to be biased conductive, said control means including means for permitting a change in state of said switching means only substantially at a time when said charge circuit is disabled and said discharge circuit enabled.

3. A switching circuit for connecting and disconnecting a voltage source and an electrical load comprising, a direct voltage source having positive and negative terminals, an N-channel field effect transistor having a gate, a drain and a source, means connecting said drain to the positive terminal of said voltage source, an electrical load connected between said source of said transistor and said negative terminal, a capacitor, a charge circuit for charging said capacitor, a discharge circuit for discharging said capacitor, means responsive to the voltage across said capacitor attaining a predetermined charge voltage when said capacitor is charging for disabling said charge circuit while substantially simultaneously enabling said discharge circuit to cause said capacitor to begin to discharge, means responsive to said capacitor attaining said predetermined voltage for causing the voltage of said voltage source and the voltage attained by said capacitor to be added in series to provide a gate bias voltage that is substantially the sum of the voltage of said voltage source and the voltage attained by said capacitor and for applying said gate bias voltage across said gate and said negative terminal to thereby bias said transistor conductive between its drain and source, a switching means connected between said gate and said negative terminal, means for sensing said gate bias voltage as said capacitor discharges and for causing said switching means to be biased conductive when said gate bias voltage decreases to a first predetermined value due to discharge of said capacitor to thereby cause said transistor to be biased nonconductive, and means responsive to said gate bias voltage decreasing to a second predetermined value for causing said charge circuit to be re-enabled and said discharge circuit disabled, said second predetermined value being less than said first predetermined value.

4. A switching circuit for connecting and disconnecting a voltage source and an electrical load comprising, a direct voltage source having positive and negative terminals, an N-channel field effect transistor having a gate, a drain and a source, means connecting said drain to the positive terminal of said voltage source, an electrical load connected between said source of said transistor and said negative terminal, a capacitor, means connecting one end of said capacitor to a junction, means connecting the opposite end of said capacitor to said positive terminal of said voltage source, means connecting said junction to said gate, a charge circuit for charging said capacitor from said voltage source, a discharge circuit for discharging said capacitor, means connected to said junction responsive to the voltage across said capacitor attaining a predetermined charge voltage when said capacitor is charging for disabling said charge circuit while substantially simultaneously enabling said discharge circuit to cause said capacitor to begin to discharge, means responsive to said capacitor attaining said predetermined voltage for causing the voltage of said voltage source and the voltage attained by said capacitor to be added in series to provide a gate bias voltage at said junction that is substantially the sum of the voltage of said voltage source and the voltage attained by said capacitor to thereby provide a gate bias voltage that is high enough to bias said transistor conductive between its drain and source, means connected to said junction for sensing said gate bias voltage as said capacitor discharges and for causing said charge circuit to be re-enabled to recharge said capacitor when said gate bias voltage decreases to a predetermined value due to discharge of said capacitor, said predetermined value of gate bias voltage being high enough to maintain said transistor biased conductive, and control means comprising a switching means for at times connecting said gate to said negative terminal to thereby cause said transistor to be biased nonconductive, said switching means when nonconductive permitting said transistor to be biased conductive.

5. A switching circuit for connecting and disconnecting a voltage source and an electrical load comprising, a direct voltage source having positive and negative terminals, an N-channel field effect transistor having a gate, a drain and a source, means connecting said drain to the positive terminal of said voltage source, an electrical load connected between said source of said transistor and said negative terminal, a capacitor, means connecting one end of said capacitor to a junction, means connecting the opposite end of said capacitor to said positive terminal of said voltage source, means connecting said junction to said gate, a charge circuit for charging said capacitor comprising a circuit connected between the positive terminal of said voltage source and said junction and a first switching means connected between said opposite side of said capacitor and the negative terminal of said voltage source, a discharge circuit for discharging said capacitor, means connected to said junction and responsive to the voltage across said capacitor attaining a predetermined charge voltage when said capacitor is charging for biasing said first switching means nonconductive to thereby disable said charge circuit while substantially simultaneously enabling said discharge circuit to cause said capacitor to begin to discharge, the voltage of said voltage source and the voltage attained by said capacitor being added in series to provide a gate bias voltage at said junction that is substantially the sum of the voltage of said voltage source and the voltage attained by said capacitor when said first switching means is biased nonconductive to thereby provide a gate bias voltage that is high enough to bias said transistor conductive between its drain and source, means connected to said junction for sensing said gate bias voltage as said capacitor discharges and for causing said first switching means to be biased conductive to recharge said capacitor when said gate bias voltage decreases to a predetermined value due to discharge of said capacitor, said predetermined value of gate bias voltage being high enough to maintain said transistor biased conductive, and control means comprising a second switching means for at times connecting said gate to said negative terminal to thereby cause said transistor to be biased nonconductive, said second switching means when nonconductive permitting said transistor to be biased conductive.

6. A voltage regulator for a generator that has an output winding and a field winding comprising, circuit means having positive and negative direct voltage output terminals connected to said output winding, a field effect transistor having a gate, a drain and a source, means connecting said drain to said positive direct voltage output terminal, means connecting said field winding between said source of said transistor and said negative direct voltage output terminal, a capacitor, a charging circuit for charging said capacitor from said direct voltage output terminals, a discharging circuit for discharging said capacitor, a voltage responsive control circuit responsive to the magnitude of the voltage across said capacitor for disabling said charging circuit and enabling said discharging circuit when the voltage across said capacitor attains a predetermined value, means responsive to said capacitor attaining said predetermined voltage value for causing the direct voltage across said direct voltage output terminals to be added in series with the voltage across said capacitor to provide a gate bias voltage that is substantially the sum of the voltage across said direct voltage output terminals and the voltage attained by said capacitor and for applying said gate bias voltage to said gate to thereby provide a gate voltage that is high enough to bias said transistor conductive between its drain and source, means for sensing said gate bias voltage as said capacitor discharges and for causing said charging circuit to be reenabled to recharge said capacitor when said gate bias voltage decreases to a predetermined value due to discharge of said capacitor, said predetermined value of gate bias voltage being high enough to maintain said transistor biased conductive, switching means connected between said gate of said transistor and said negative terminal, said switching means when conductive causing said transistor to be biased nonconductive, and control means controlling the switching state of said switching means responsive to the output voltage of the generator for causing said switching means to become or remain biased conductive when said output voltage is above a desired regulated value and for causing said switching means to become or remain biased nonconductive when said output voltage is below said desired regulated value, said control means including means for permitting a change in state of said switching means only substantially at a time when said charge circuit is disabled and said discharge circuit enabled.

7. A voltage regulator for a generator that has an output winding and a field winding comprising, positive and negative direct voltage output terminals connected to said output winding providing a direct voltage the magnitude of which is a function of the voltage generated in said output winding, an N-channel field effect transistor having a gate electrode, a source electrode and a drain electrode, means connecting said drain electrode to said positive terminal, means connecting said field winding between said source electrode and said negative terminal, a capacitor, a junction, means connecting an end of said capacitor to said junction, means connecting an opposite end of said capacitor to said positive terminal, means connecting said junction to said gate, a charge circuit for charging said capacitor comprising a circuit that is connected between said positive terminal and said junction and a first switching means that is connected between said opposite end of said capacitor and said negative terminal, said capacitor charging through said first switching means when it is conductive, a discharge circuit for said capacitor, means connected to said junction and responsive to the voltage across said capacitor attaining a predetermined charge voltage when said capacitor is charging for biasing said first switching means nonconductive to thereby disable said charge circuit while substantially simultaneously enabling said discharge circuit to cause said capacitor to begin to discharge, the direct voltage across said output terminals and the voltage attained by said capacitor being added in series to provide a gate bias voltage at said junction that is substantially the sum of the voltage across said output terminals and the voltage attained by said capacitor when said first switching means is biased nonconductive to thereby provide a gate bias voltage that is high enough to bias said transistor conductive between its drain and source, means connected to said junction for sensing said gate bias voltage as said capacitor discharges and for causing said first switching means to be biased conductive to recharge said capacitor when said gate bias voltage decreases to a predetermined value due to discharge of said capacitor, said predetermined value of gate bias voltage being high enough to maintain said transistor biased conductive, a second switching means connected between said gate and said negative terminal, said second switching means when conductive causing said transistor to be biased nonconductive, said second switching means when nonconductive permitting the gate bias voltage developed at said junction to bias said transistor conductive, and control means controlling the switching state of said second switching means responsive to the magnitude of the voltage across said output terminals for causing said second switching means to become or remain biased conductive when the voltage across said output terminals is above a desired regulated value and for causing said second switching means to become or remain biased nonconductive when the voltage across said output terminals is below said desired regulated value, said control means being responsive to the switching state of said first switching means and including means for permitting a change in state of said second switching means only substantially at a time when said first switching means is biased nonconductive.

8. The voltage regulator according to claim 7 wherein a resistor is connected between said gate electrode and said junction, said resistor and the gate capacitance of said transistor forming a filter circuit to smooth the voltage applied to said gate electrode from said junction.

9. The voltage regulator according to claim 7 wherein the voltage regulator includes strobe control means responsive to the output voltage of the generator for shifting the regulator into a strobing mode wherein said field effect transistor is biased conductive for consecutive occurring periods of time that have a predetermined duty cycle, said regulator being shifted into said strobing mode when the output voltage of the generator is zero or below a predetermined value, a third switching means connected between said gate and said negative terminal, said regulator when in said strobing mode including means operative to cause said third switching means to be biased conductive when said gate voltage decreases to a voltage level that is higher in voltage magnitude than said predetermined voltage value that causes said capacitor to recharge during the time that said capacitor is discharging.

10. A voltage regulator for a generator that has an output winding and a field winding comprising, positive and negative output terminals connected to said output winding having a direct voltage thereacross that is a function of the magnitude of the output voltage developed by said output winding, an N-channel field effect transistor having a gate electrode, a drain electrode and a source electrode, means connecting said drain electrode to said positive terminal, means connecting said field winding between said source electrode and said negative terminal, means connecting said gate electrode to a junction, a capacitor one side of which is connected to said junction, means connecting the opposite side of said capacitor to said positive terminal, means for repetitively charging and discharging said capacitor and for causing the gate bias voltage that is developed at said junction to be substantially equal to the sum of the capacitor voltage and the voltage across said terminals when capacitor charging is terminated and capacitor discharge begins, means for causing said capacitor to be recharged and capacitor discharge terminated when said gate bias voltage decreases to a predetermined value during discharge of said capacitor, said predetermined value being high enough to maintain said transistor biased conductive, the consecutive occurring charge and discharge periods of said capacitor being substantially equal to a timing period, and control means for causing said transistor to be biased conductive for a total time period that is substantially equal to the sum of a plurality of timing periods when the output voltage of said generator is below a desired regulated value and for causing said transistor to be biased nonconductive for a total time period that is substantially equal to the sum of a plurality of timing periods when the output voltage of the generator is above said desired regulated value.

11. The voltage regulator according to claim 10 wherein means are provided to cause the discharge period of the capacitor to be shorter when the output voltage of the generator is above the desired regulated value than it is when the generator output voltage is below the desired regulated value.

12. The voltage regulator according to claim 10 wherein the control means includes means for permitting a change in switching state of said field effect transistor only substantially at a time when the capacitor charge period terminates and the capacitor discharge period begins.

13. The voltage regulator according to claim 10 wherein said gate electrode is connected to said junction by a resistor and wherein said resistor and the gate capacitance of said field effect transistor forms an RC filter circuit.

14. A voltage regulator for a diode-rectified alternating current generator that supplies the electrical loads on a motor vehicle including the charging of a storage battery comprising, an alternating current generator having a rotor driven by the engine, a field winding and an output winding, rectifier means connected to said output winding having positive and negative direct voltage output terminals, a storage battery connected across said output terminals, an N-channel field effect transistor having a gate electrode, a drain electrode and a source electrode, means connecting said drain electrode to said positive terminal, means connecting said field winding between said source electrode and said negative terminal, means connecting said gate electrode to a junction, a capacitor one side of which is connected to said junction, means connecting the opposite side of said capacitor to said positive terminal, means for repetitively charging and discharging said capacitor and for causing the gate bias voltage that is developed at said junction to be substantially equal to the sum of the capacitor voltage and the voltage across said terminals when capacitor charging is terminated and capacitor discharge begins, means for causing said capacitor to be recharged and capacitor discharge terminated when said gate bias voltage decreases to a predetermined value during discharge of said capacitor, said predetermined value being high enough to maintain said transistor biased conductive, the consecutive occurring charge and discharge periods of said capacitor being substantially equal to a timing period, control means operative when said regulator is in a regulation mode for causing said transistor to be biased conductive for a total time period that is substantially equal to the sum of a plurality of timing periods when the output voltage of said generator is below a desired regulated value and for causing said transistor to be biased nonconductive for a total time period that is substantially equal to the sum of a plurality of timing periods when the output voltage of the generator is above said desired regulated value, and means responsive to a condition of operation wherein said generator rotor is not rotating for causing said voltage regulator to shift from said regulation mode to a field strobing mode, said regulator when in said field strobing mode causing said field effect transistor to be biased conductive for consecutive occurring time periods that have a predetermined duty cycle whereby said field winding is energized from said battery with an average current that is a function of said duty cycle, said regulator when in said field strobing mode including means for biasing said field effect transistor nonconductive when said capacitor is discharging and when the gate voltage at said junction decreases to a first predetermined value and for causing said capacitor to be recharged and capacitor discharge terminated when said gate voltage at said junction decreases further to a second predetermined value that is lower than said first predetermined value.

15. The voltage regulator according to claim 14 wherein the means for biasing the field effect transistor nonconductive when the regulator is in the field strobing mode comprises a switching means connected between said gate and said negative terminal, said switching means being biased conductive when said gate voltage decreases to said first predetermined value during capacitor discharge.

* * * * *